United States Patent
Liao et al.

(10) Patent No.: US 9,812,641 B2
(45) Date of Patent: Nov. 7, 2017

(54) NON-VOLATILE MEMORY DEVICE AND METHODS FOR FABRICATING THE SAME

(71) Applicant: Windbond Electronics Corp., Taichung (TW)

(72) Inventors: Hsiu-Han Liao, Hsinchu (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/500,492

(22) Filed: Sep. 29, 2014

(65) Prior Publication Data

US 2015/0280121 A1    Oct. 1, 2015

(30) Foreign Application Priority Data

Mar. 26, 2014  (TW) ............................... 103111180 A

(51) Int. Cl.
*H01L 45/00* (2006.01)
*H01L 27/24* (2006.01)

(52) U.S. Cl.
CPC .......... *H01L 45/16* (2013.01); *H01L 27/2436* (2013.01); *H01L 27/2463* (2013.01); *H01L 45/04* (2013.01); *H01L 45/1233* (2013.01)

(58) Field of Classification Search
CPC .................................................. H01L 27/2436
USPC ............................................................ 257/4
See application file for complete search history.

(56) References Cited

U.S. PATENT DOCUMENTS

| | | | | |
|---|---|---|---|---|
| 7,016,222 B2* | 3/2006 | Morikawa | ............... | G11C 11/15 365/148 |
| 8,785,314 B2* | 7/2014 | Pellizzer | ................. | H01L 45/06 438/104 |
| 2008/0175036 A1* | 7/2008 | Oh | ..................... | G11C 13/0007 365/148 |
| 2009/0027955 A1* | 1/2009 | Koh | .................... | G11C 13/0007 365/163 |
| 2012/0074466 A1* | 3/2012 | Setiadi | ............ | H01L 21/823487 257/204 |
| 2012/0149166 A1* | 6/2012 | Park | ........................ | C23C 16/34 438/382 |
| 2013/0308367 A1* | 11/2013 | Chih | ....................... | H01L 45/04 365/148 |
| 2014/0177315 A1* | 6/2014 | Pramanik | ........... | G11C 13/0069 365/148 |

(Continued)

*Primary Examiner* — Jarrett Stark
*Assistant Examiner* — Charles N Ausar-El
(74) *Attorney, Agent, or Firm* — Muncy, Geissler, Olds & Lowe, P.C.

(57) ABSTRACT

The invention provides a non-volatile memory device and methods for fabricating the same. The non-volatile memory device includes a non-volatile memory cell including a first transistor and a second transistor disposed on a substrate. The first and second transistors commonly use a first source region. A first gate of the first transistor and a second gate of the second transistor are different portions of a word line. First and second resistive switching elements are coupled to a first drain region of the first transistor and a second drain region of the second transistor. A first source line is coupled to the source region. First and second bit lines are coupled to the first and second resistive switching elements. The first source line, the first and second bit lines belong to a metal layer and are parallel to each other.

10 Claims, 9 Drawing Sheets

(56) References Cited

U.S. PATENT DOCUMENTS

| | | | |
|---|---|---|---|
| 2015/0249211 A1* | 9/2015 | Knobloch | H01L 27/2463 257/5 |
| 2015/0255513 A1* | 9/2015 | Nakakubo | H01L 27/2481 365/148 |
| 2015/0255715 A1* | 9/2015 | Takagi | G11C 13/0011 365/148 |
| 2015/0263068 A1* | 9/2015 | Ito | H01L 27/228 365/158 |
| 2016/0087201 A1* | 3/2016 | Sutardja | G11C 13/0007 365/148 |
| 2016/0099291 A1* | 4/2016 | Tsai | H01L 27/2463 257/4 |
| 2016/0358660 A1* | 12/2016 | Nam | G11C 16/14 |

* cited by examiner

NON-VOLATILE MEMORY DEVICE AND METHODS FOR FABRICATING THE SAME

CROSS REFERENCE TO RELATED APPLICATIONS

This Application claims priority of Taiwan Patent Application No. 103111180, filed on Mar. 26, 2014, the entirety of which is incorporated by reference herein.

BACKGROUND OF THE INVENTION

Field of the Invention

The present invention relates to a non-volatile memory device and methods for fabricating the same, and in particular it relates to a resistive random access memory (RRAM) device and methods for fabricating the same.

Description of the Related Art

Resistive random access memory (RRAM) has recently gained tremendous popularity due to the advantages of low power consumption, low operation voltage, high writing and erasing speeds, high endurance, long data-retention time, reading without damage, multiple memory states, simple structure and scalability. The basic structure of the conventional RRAM is a metal-insulator-metal (MIM) lamination constructed by a bottom electrode, a resistive switching layer, and a top electrode. The resistive switching (RS) of the RRAM is an important device characteristic. The conventional RRAM, however, has a limited space for routings due to the arrangements of the word lines, the bit lines and the source lines.

Thus, a novel a resistive random access memory (RRAM) device and methods for fabricating the same are desirable.

BRIEF SUMMARY OF THE INVENTION

A non-volatile memory device and methods for fabricating the same are provided. An exemplary embodiment of a non-volatile memory device includes a non-volatile memory cell configured to store two-bit data. The non-volatile memory cell includes a first transistor and a second transistor disposed on a substrate. The first transistor and the second transistor commonly use a first source region. A first gate of the first transistor and a second gate of the second transistor are different portions of a word line. A first resistive switching element and a second resistive switching element are respectively coupled to a first drain region of the first transistor and a second drain region of the second transistor. A first source line is coupled to the first source region. A first bit line is coupled to the first resistive switching element. A second bit line is coupled to the second resistive switching element. The first source line, the first bit line and the second bit line belong to the same metal layer and are parallel to each other. The word line is perpendicular to the first source line, the first bit line and the second bit line, respectively.

An exemplary embodiment of a method for fabricating a non-volatile memory device includes providing a substrate. A gate strip structure is formed on the substrate along a first direction. The gate strip structure serves as a word line. A first source region and a second source region are formed on a first side of the gate strip structure. A first pair of drain regions and a second pair of drain regions are formed on a second side of the gate strip structure. A first source contact is formed to be coupled to the first source region and the second source region. A first bottom electrode contact plug, a second bottom electrode contact plug, a third bottom electrode contact plug and a fourth bottom electrode contact plug are formed on the substrate and coupled to the first and second pairs of drain regions, respectively. A first resistive switching element, a second resistive switching element, a third resistive switching element and a fourth resistive switching element are formed on the first, second, third and fourth bottom electrode contact plugs, respectively. A first top electrode contact plug and a second top electrode contact plug are formed on the first, second, third and fourth resistive switching elements. The first top electrode contact plug is coupled to the first and second resistive switching elements. The second top electrode contact plug is coupled to the third and fourth resistive switching elements. A source contact plug is formed on the first source contact. A first bit line and a second bit line are formed on the first and second top electrode contact plugs. The first and second bit lines respectively are coupled to the first and second top electrode contact plugs. A first source line is formed on the source contact plug. The first source line is coupled to the first source region. The first source line, the first bit line and the second bit line belong to a metal layer. The first source line, the first bit line and the second bit line are extended along a second direction and are parallel to each other. The word line is perpendicular to the first source line, the first bit line and the second bit line.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 4-6 also illustrate a dual-damascene process for forming a top electrode contact plug.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

Embodiments provide a non-volatile memory device, for example, a random access memory (RRAM) device. A RRAM device cell of the RRAM device is used for two-bit data storage. The non-volatile memory device is designed in a way such that both a source line and a bit line of the non-volatile memory device belong to the same metal layer and are parallel to each other. Also, a word line of the non-volatile memory device, which belongs to another metal layer, is perpendicular to the source line and the bit line to increase the space for the routings.

Figure 1:
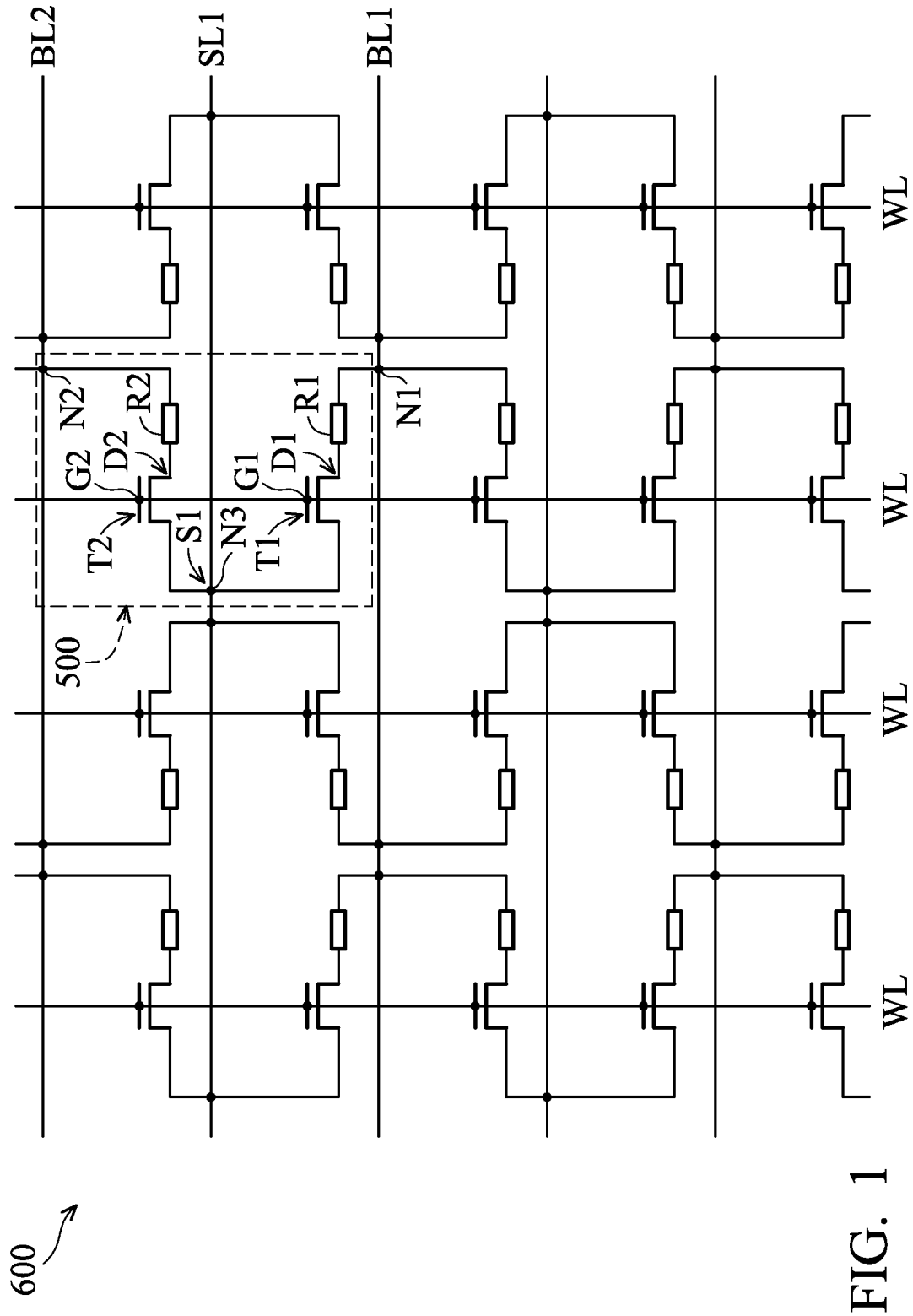
FIG. 1 is a schematic diagram of a circuit of one exemplary embodiment of a non-volatile memory device of the disclosure, and the non-volatile memory device includes an array constructed by a plurality of non-volatile memory cells.

FIG. 1 is a schematic diagram of a circuit of one exemplary embodiment of a non-volatile memory device 600 of the disclosure. In one embodiment, the non-volatile memory device 600 includes an array constructed by a plurality of non-volatile memory cells 500. In this embodiment, each of the non-volatile memory cells 500 is configured to store two-bit data. The non-volatile memory cell 500 includes a first transistor T1, a second transistor T2, a first resistive switching element R1 and a second resistive switching element R2. In one embodiment, the first transistor T1 and the second transistor T2 commonly use a source region S1. The first resistive switching element R1 and the second resistive switching element R2 are respectively coupled to a first drain region D1 of the first transistor T1 and a second drain region D2 of the second transistor T2. In one embodiment, the non-volatile memory device 600 further includes a word line WL, a first source line SL1, a first bit line BL1 and a second bit line BL2. In one embodiment as shown in FIG. 1, a first gate G1 of the first transistor T1 and a second gate G2 of the second transistor T2 are coupled to the word line WL. The first bit line BL1 is coupled to a node N1 of the first resistive switching element R1, the second bit line BL2 is coupled to a node N2 of the second resistive switching element R2. Additionally, the first source line SL1 is coupled to a node N3 of the source region S1. In one embodiment, the first source line SL1, the first bit line BL1 and the second bit line BL2 are designed to belong to the same metal layer and parallel to each other. Also, the word line WL is designed to be perpendicular to the first source line SL1, the first bit line BL1 and the second bit line BL2, as shown in FIG. 1.

Figure 2:
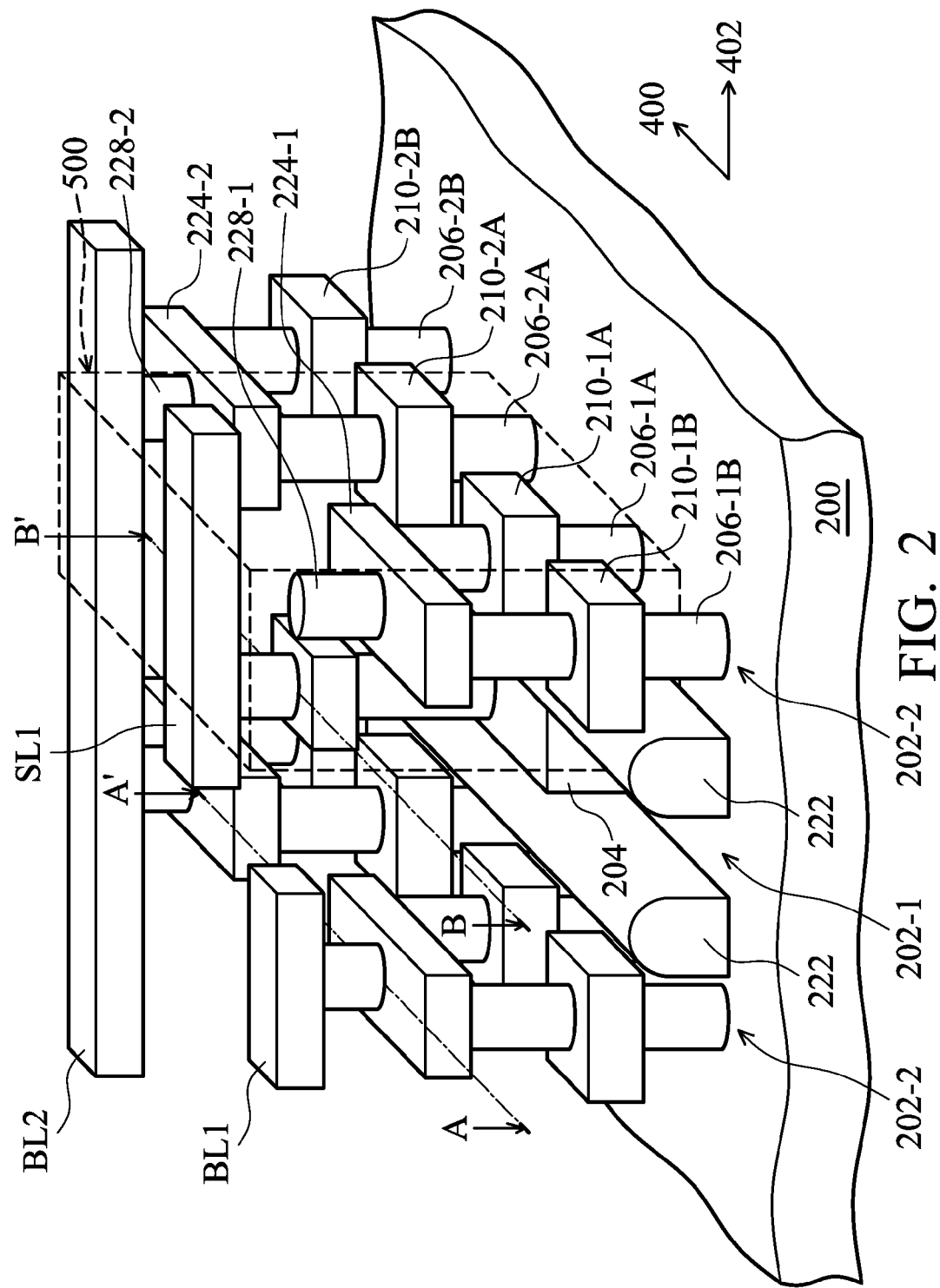
FIG. 2 is a three-dimensional (3D) schematic diagram of one exemplary embodiment of a non-volatile memory device of the disclosure.
Figure 3A:
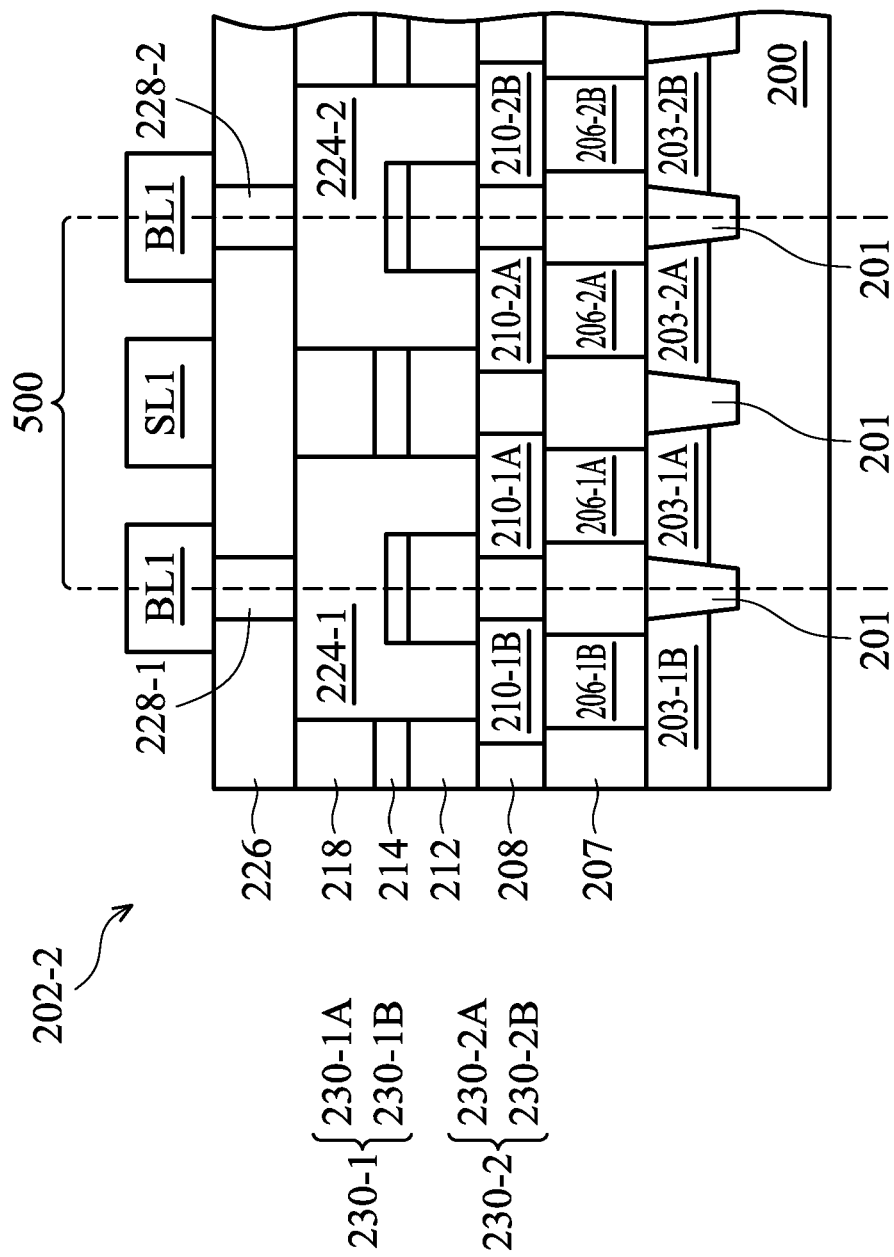
FIG. 3A is a cross section taken along line A-A' of FIG. 2, showing the electrical connection between one exemplary embodiment of a non-volatile memory device and a bit line of the disclosure.
Figure 3B:
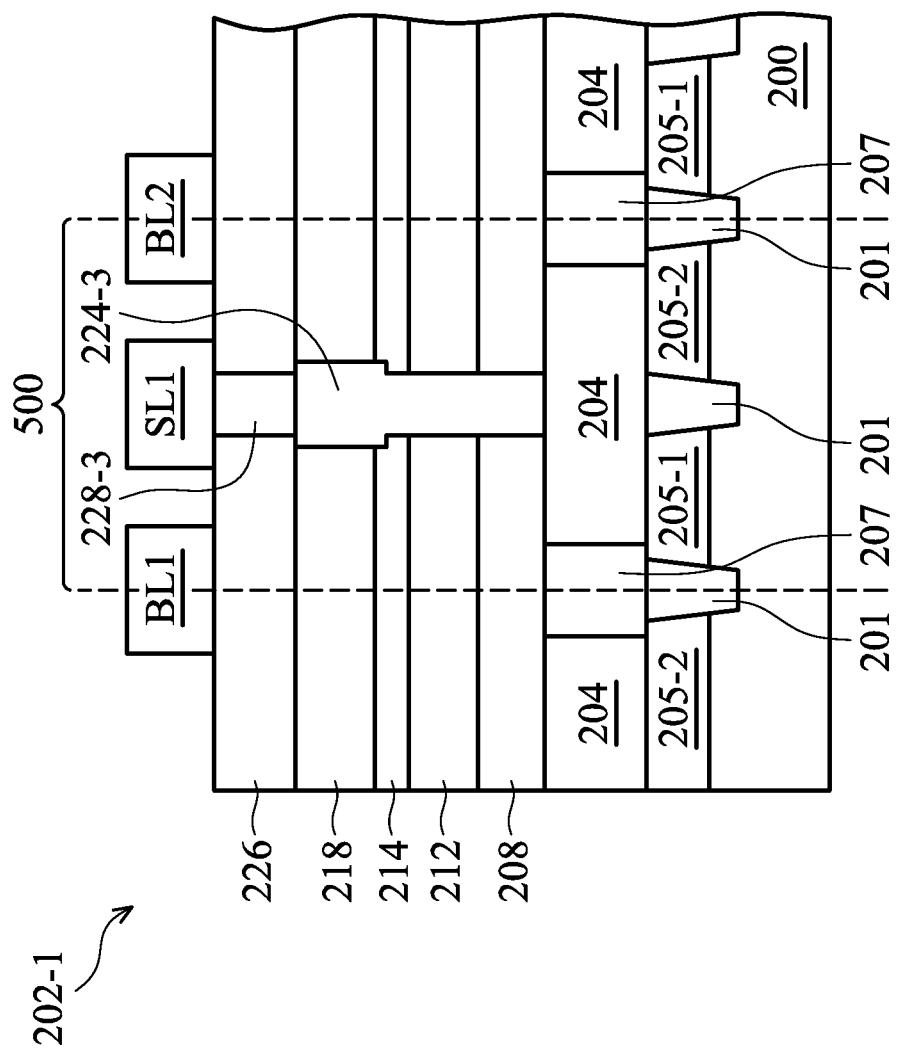
FIG. 3B is a cross section taken along line B-B' of FIG. 2, showing the electrical connection between one exemplary embodiment of a non-volatile memory device and a source line of the disclosure.

FIG. 2 is a three-dimensional (3D) schematic diagram of one exemplary embodiment of a non-volatile memory device 600 of the disclosure. FIG. 3A is a cross section taken along line A-A' of FIG. 2, showing the electrical connection between one exemplary embodiment of a non-volatile memory device and a bit line of the disclosure. FIG. 3B is a cross section taken along line B-B' of FIG. 2, showing the electrical connections between one exemplary embodiment of a non-volatile memory cell and a source line of the disclosure. For the convenience of illustration of the relationship of the electrical connections among the non-volatile memory cell, the bit line and the source line, dielectric layers and insulating layers above the substrate (substrate 200) in FIGS. 3A and 3B are not shown in FIG. 2.

Figure 7:
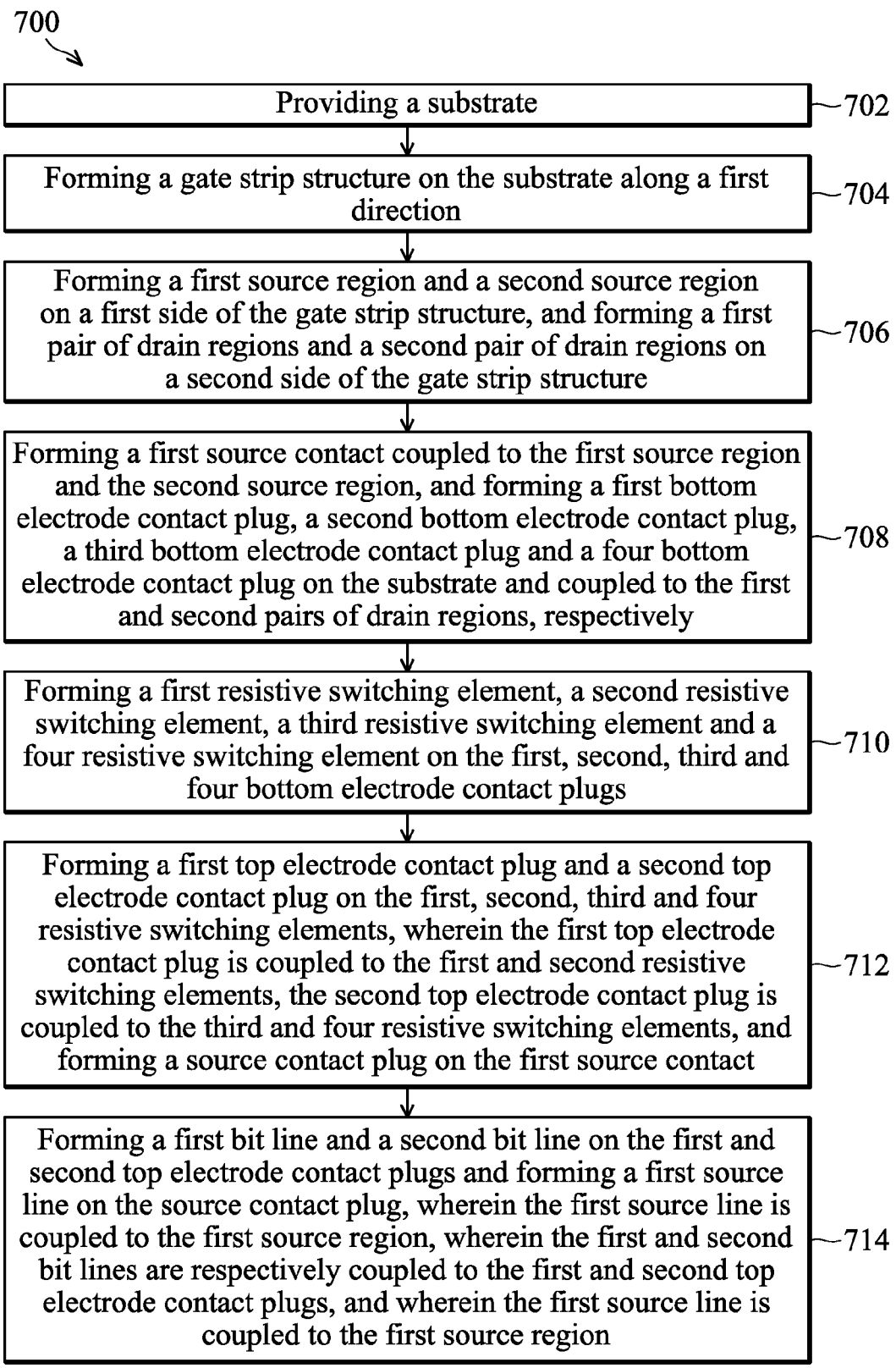
FIG. 7 is a flow chart showing one exemplary embodiment of a method for fabricating a non-volatile memory device of the disclosure.

FIG. 7 is a flow chart showing one exemplary embodiment of a method 700 for fabricating a non-volatile memory device of the disclosure. In this embodiment, the method fabricating one non-volatile memory device is used as an embodiment to describe the electrical connections of the word line, bit line and source line in detail. The method, however, is also used to fabricate an array of the non-volatile memory device constructed by a plurality of the non-volatile memory cells. FIGS. 2, 3A, 3B and 7 are used to describe one exemplary embodiment of the method 700 for fabricating a non-volatile memory device of the disclosure. Initially, a step 702 is performed to provide a substrate 200. In one embodiment, the substrate 200 may comprise a semiconductor substrate, for example, a silicon substrate. Also, the substrate 200 may be a P-type or N-type substrate. In one embodiment, the substrate 200 may comprise a plurality of isolation structures 201 within. The isolation structures 201 are formed extending from a surface of the substrate 200 into an interior of the substrate 200. In one embodiment, the isolation structures 201 may comprise shallow trench isolations (STIs). The isolation structures 201 may be used to define active regions for electronic devices formed thereon, and serving as electrical isolations between the electronic devices formed in the various active regions.

Next, an electronic device, for example, a transistor, is formed on the substrate 200. The electronic device is configured to apply an operation voltage to a non-volatile memory device. Step 704 is performed using a thin film deposition process and a patterning process to form a gate strip structure 222 on the substrate 200 along a first direction 400. In one embodiment, the gate strip structure 222 may include a gate oxide layer and a gate layer on the gate oxide layer. In one embodiment, the gate strip structure 222 may serve as a word line (WL) of the non-volatile memory cell 500.

Next, step 706 is performed to perform an implantation process to form a first source region 205-1 and a second source region 205-2 on a first side (a source side) 202-1 of the gate strip structure 222 (FIG. 3B). Also, a first pair of drain regions 203-1 and a second pair of drain regions 203-2 are formed on a second side 202-2 of the gate strip structure (FIG. 3A). In one embodiment, the first source region 205-1 and the second source region 205-2 are separated from each other by the isolation structures 201. In one embodiment, the first pair of drain regions 203-1 and the second pair of drain regions 203-2 are also separated from each other by the isolation structures 201. The first pair of drain regions 203-1 may include a first drain region 203-1A and a second drain region 203-1B separated from each other, and the second pair of drain regions 203-2 may include a third drain region 203-2A and a fourth drain region 203-2B separated from each other.

Next, step 708 is performed to form a first source contact 204 on the substrate 200O. The first source contact 204 is coupled to the first source region 205-1 and the second source region 205-2. Also, electrode contact plugs 206-1A, 206-1B, 206-2A and 206-2B are formed on the substrate 200. The first pair of drain regions 203-1 and the second pair of drain regions 203-2 are coupled to the first pair of drain regions 203-1 and the second pair of drain regions 203-2, respectively. In one embodiment, a dielectric layer 207 is entirely formed by a thin-film deposition process including a chemical vapor deposition (CVD) method or a plasma enhanced chemical vapor deposition (PECVD) method. Next, a plurality of openings is formed in the dielectric layer 207 by a patterning process including a photolithography method and an anisotropic etching method. The openings define formation positions of the first source contact 204 and the electrode contact plugs 206-1A, 206-1B, 206-2A and 206-2B. Also, the first source region 205-1, the second source region 205-2, the first pair of drain regions 203-1 and the second pair of drain regions 203-2 are exposed to the openings. Next, a barrier layer formed of Ti or TiN is deposited on a sidewall of the opening using a CVD method. A conductive material (not shown), such as tungsten (W), is then filled into the openings. Next, a planarization process, for example, a chemical mechanical polishing (CMP) process, is performed on the conductive material to remove unnecessary portions of the conductive material above a top surface of the dielectric layer 207, so that the first source contact 204 and the electrode contact plugs 206-1A, 206-1B, 206-2A and 206-2B are respectively formed in the openings. As shown in FIGS. 3A and 3B, the electrode contact plugs 206-1A, 206-1B, 206-2A, 206-2B are respectively coupled to the first pair of drain regions 203-1 and the second pair of drain regions 203-2. More specifically, the electrode contact plugs 206-1A and 206-1B are respectively coupled to the first drain region 203-1A and the second drain region 203-1B of the first pair of drain regions 203-1. Also, the electrode contact plugs 206-2A and 206-2B are respectively coupled to the third drain region 203-2A and the fourth drain region 203-2B of the second pair of drain regions 203-2. As shown in FIG. 3B, the first source contact 204 is coupled to both the first source region 205-1 and the second source region 205-2.

Next, step 710 is performed to form resistive switching elements 210-1A, 210-1B, 210-2A and 210-2B on the electrode contact plugs 206-1A, 206-1B, 206-2A and 206-2B, respectively. In one embodiment, the resistive switching elements 210-1A, 210-1B, 210-2A and 210-2B respectively include a bottom electrode, a resistive switching layer and a top electrode. The bottom electrode is disposed on and in contact with the electrode contact plug. The resistive switching layer is disposed on the bottom electrode. The top electrode is disposed on the resistive switching layer. The bottom electrode, the resistive switching layer and the top electrode may form a metal-insulator-metal (MIM) laminating layers. In one embodiment, a dielectric layer 208 having a plurality of openings is formed on the dielectric layer 207 using methods similar to those in step 708. The electrode contact plugs 206-1A, 206-1B, 206-2A, 206-2B are respectively exposed to the openings to define formation positions of the resistive switching elements 210-1A, 210-1B, 210-2A and 210-2B. In one embodiment, bottom electrodes of the resistive switching elements 210-1A, 210-1B, 210-2A and 210-2B are formed in the openings of the dielectric layer 208 by an electron beam vacuum evaporation method or a sputtering method. Also, the resistive switching layers respectively grow on the bottom electrodes by an atomic layer deposition (ALD) method. Additionally, the top electrodes are respectively formed on the resistive switching layers by an electron beam vacuum evaporation method. Next, a planarization process, for example, a chemical mechanical polishing (CMP) process, is performed on the conductive material to remove unnecessary portions of the conductive material above a top surface of the dielectric layer 208, so that the resistive switching elements 210-1A, 210-1B, 210-2A and 210-2B are formed in the openings of the dielectric layer 208. As shown in FIGS. 2 and 3A, the resistive switching elements 210-1A, 210-1B, 210-2A and 210-2B are electrically connected to (and in contact with) the electrode contact plugs 206-1A, 206-1B, 206-2A and 206-2B.

Next, step 712 is performed to form top electrode contact plugs 224-1 and 224-2 on the resistive switching elements 210-1A, 210-1B, 210-2A and 210-2B. In one embodiment, the top electrode contact plug 224-1 is coupled to both of the resistive switching elements 210-1A and 210-1B. In one embodiment, the top electrode contact plug 224-2 is coupled to both of the resistive switching elements 210-2A and 210-2B.

Figure 4:
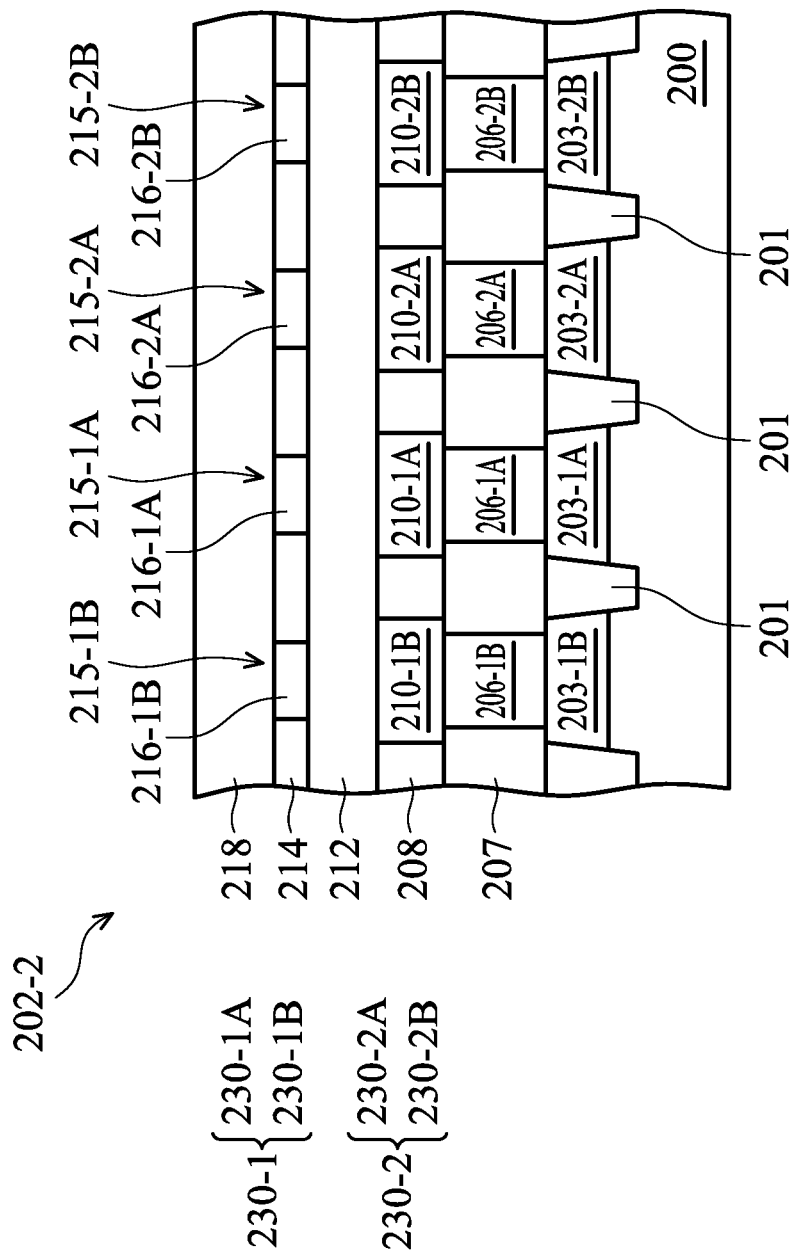
FIGS. 4-6 are cross sections showing one exemplary embodiment of a method for fabricating a non-volatile memory device of the disclosure.
Figure 5:
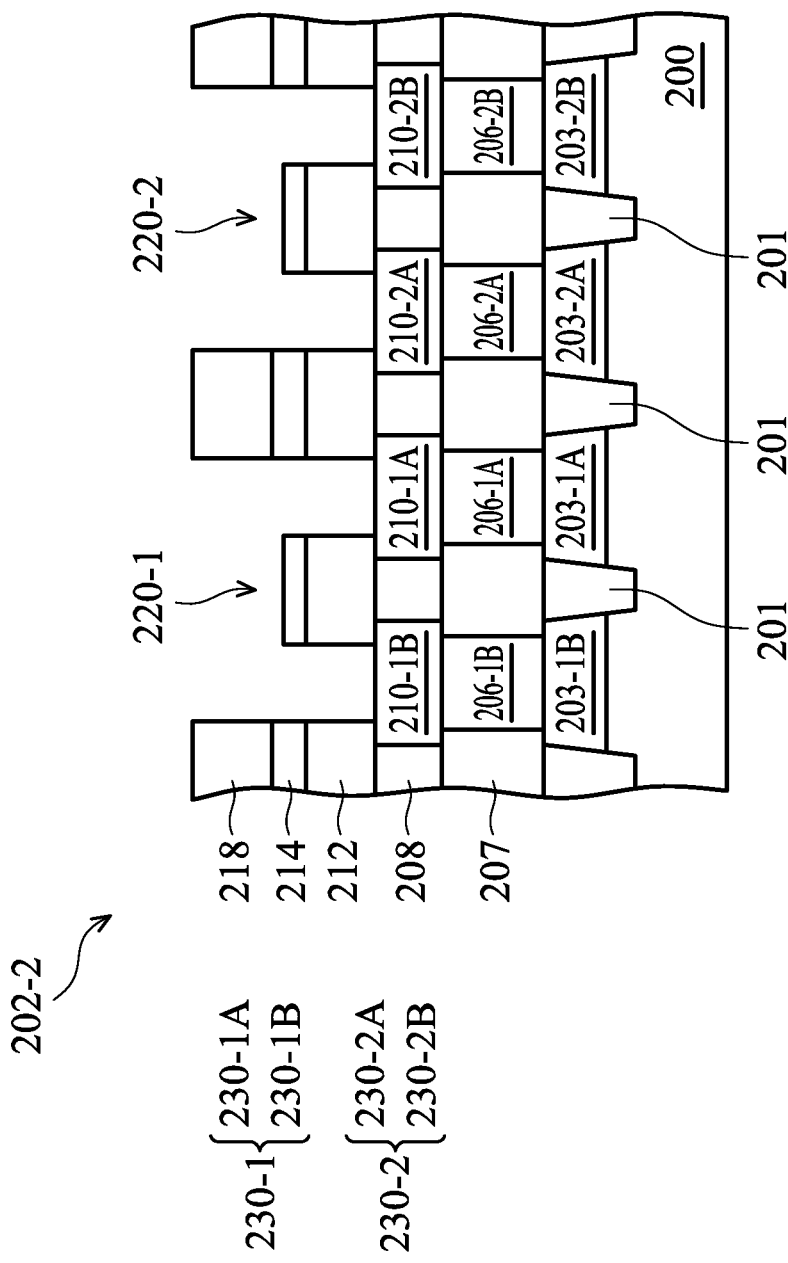
Figure 6:
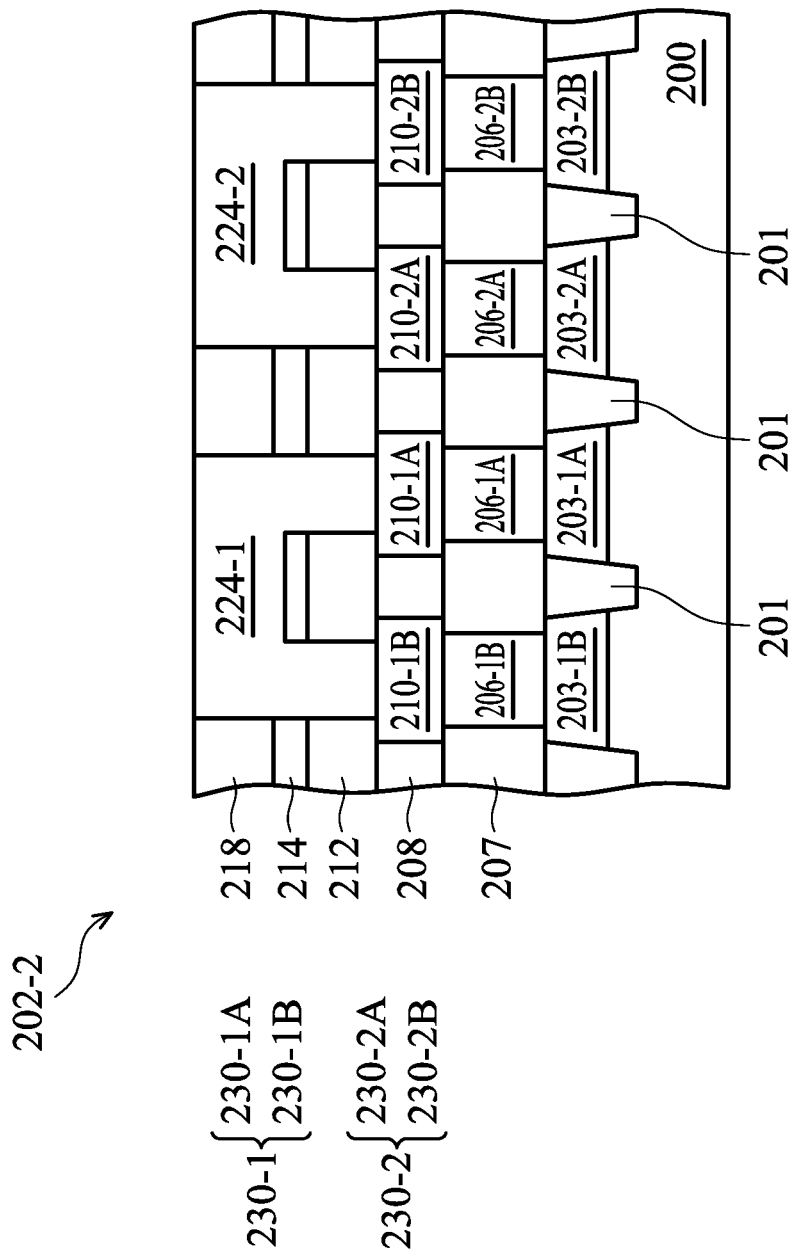

In one embodiment, the top electrode contact plugs 224-1 and 224-2 are formed using the dual-damascene process as shown in FIGS. 4-6. Please refer to FIG. 4, in one embodiment, a first insulating layer 212 and a second insulating layer 214 are sequentially formed on the resistive switching elements 210-1A, 210-1B, 210-2A and 210-2B using a thin film deposition process including an ALD, CVD or PECVD method. In one embodiment, the first insulating layer 212 and the second insulating layer 214 are formed of different materials. In this embodiment, the first insulating layer 212 may be an oxide layer, and the second insulating layer 214 may be a nitride layer.

Next, please refer to FIG. 4, a patterning process (including a photolithography method and a subsequent anisotropic etching method) is performed on second insulating layer 214 at a second side 202-2 (a drain side) (shown in FIGS. 2 and 4) of the gate strip structure 222 to form openings 215-1A, 215-1B, 215-2A and 215-2B in the second insulating layer 214. In one embodiment, the openings 215-1A, 215-1B, 215-2A and 215-2B are disposed directly on the resistive switching elements 210-1A, 210-1B, 210-2A and 210-2B, respectively. Next, a third insulating material is filled into the openings 215-1A, 215-1B, 215-2A and 215-2B using a thin film deposition process including an ALD, CVD or PECVD method and a subsequent planarization process such as a CMP method. Therefore, third insulating material patterns 216-1A, 216-1B, 216-2A and 216-2B are formed in the openings 215-1A, 215-1B, 215-2A and 215-2B. Next, a fourth insulating layer 218 is formed on the second insulating layer 214 using a thin film deposition process including an ALD, CVD or PECVD method. In one embodiment, the first insulating layer 212, the third insulating material patterns 216-1A, 216-1B, 216-2A, 216-2B and the fourth insulating layer 218 are formed by the same material, for example, oxide. The second insulating layer 214 is formed of materials that are different from the materials used to form the first insulating layer 212, the third insulating material patterns 216-1A, 216-1B, 216-2A, 216-2B and the fourth insulating layer 218.

Next, please refer to FIG. 5. Another patterning process (including a photolithography method and a subsequent anisotropic etching method) is performed to remove a portion of the fourth insulating layer 218, which is positioned above the third insulating material patterns 216-1A and 216-1B (shown in FIG. 4), a portion of the first insulating layer 212, which is positioned under the third insulating material 216-1A and 216-1B, and the third insulating material patterns 216-1A and 216-1B until the resistive switching elements 210-1A and 210-1B are exposed. Meanwhile, the patterning process may also remove another portion of the fourth insulating layer 218, which is positioned laterally between the third insulating material 216-1A and 216-1B. After performing the patterning process, an opening 220-1 is formed in the first insulating layer 212, the second insulating layer 214 and the fourth insulating layer 218. Because the second insulating layer 214 is formed materials different from the materials used to form the first insulating layer 212, the third insulating material patterns 216-1A, 216-1B, 216-2A, 216-2B (shown in FIG. 4) and the fourth insulating layer 218. The second insulating layer 214 may serve as an etch-stop layer in the patterning process. In one embodiment, the opening 220-1 connects the openings 215-1A, 215-1B, and the resistive switching elements 210-1A and 210-1B are exposed to the opening 220-1. Similarly, the patterning process is performed to form an opening 220-2 in the first insulating layer 212, the second insulating layer 214 and the fourth insulating layer 218. In one embodiment, the opening 220-2 connects the openings 215-2A, 215-2B, and the resistive switching elements 210-2A and 210-2B are exposed to the opening 220-2.

Next, please refer to FIG. 6. A barrier layer formed of Ti or TiN is deposited on sidewalls of the openings 220-1 and 220-2 using a CVD method. A conductive material (not shown), such as tungsten (W), is then filled into the openings 220-1 and 220-2. Next, a planarization process, for example, a chemical mechanical polishing (CMP) process, is performed on the conductive material to remove unnecessary portions of the conductive material above a top surface of the fourth insulating layer 218, so that top electrode contact plugs 224-1 and 224-2 are formed in the openings 220-1 and 220-2.

In one embodiment as shown in FIG. 3B, a source contact plug 224-3 is also formed in the first insulating layer 212, the second insulating layer 214 and the fourth insulating layer 218 using the dual-damascene process. In one embodiment, the source contact plug 224-3 is electrically connected to the first source contact 204.

Compared to the conventional via plug fabrication process, one planarization process for a conductive material, such as tungsten (W), can be eliminated during fabricating one embodiment of the top electrode contact plugs using the dual-damascene process.

Next, as shown in FIGS. 3A and 3B, a dielectric layer 226 having a plurality of openings (not shown) is formed on the fourth insulating layer 218 using processes similar to step 708. Also, the top electrode contact plugs 224-1 and 224-2 are exposed to the openings. Next, a barrier layer formed of Ti or TiN is deposited on sidewalls of the openings using a CVD method. A conductive material (not shown), such as tungsten (W), is then filled into the openings. Next, a planarization process, for example, a chemical mechanical polishing (CMP) process is performed on the conductive material to remove unnecessary portions of the conductive material above a top surface of the fourth insulating layer 226, so that contact plugs 228-1, 228-2 and 228-3 are formed in the openings, respectively. In one embodiment, the contact plugs 228-1 and 228-2 are electrically connected to the top electrode contact plugs 224-1 and 224-2, respectively. The contact plug 228-3 is electrically connected to the top electrode contact plug 224-3.

Next, as shown in FIGS. 3A and 3B, step 714 is performed to form a first bit line BL1 and a second bit line BL2 on the top electrode contact plugs 224-1 and 224-2, respectively. Also, a first source line SL1 is formed on the contact plug 228-3. As shown in FIGS. 3A and 3B, the first bit line BL1 and the second bit line BL2 are coupled to the top electrode contact plugs 224-1 and 224-2, respectively. The first source line SL1 is coupled to the first source region 205-1. In one embodiment, the first bit line BL1, the second bit line BL2 and the first source line SL1 may be formed by a physical vapor deposition process, such as a sputtering method, and a subsequent patterning process. In one embodiment, the first bit line BL1, the second bit line BL2 and the first source line SL1 are designed to be positioned belonging the same metal layer (such as the first metal layer (M1)), extending along a second direction 402 and parallel to each other.

Please refer FIGS. 2, 3A and 3B, in one embodiment, the single non-volatile memory cell 500 includes two transistors and two resistive switching elements 210-1A and 210-2A. The first transistor (such as the first transistor T1 as shown in FIG. 1) of the non-volatile memory cell 500 is constructed by the first source region 205-1, the first drain region 203-1A of the first pair of drain regions 203-1, and a portion of the gate strip structure 222 (such as the first gate G1 as shown in FIG. 1) between the first source region 205-1 and the first drain region 203-1A. The second transistor (such as the first transistor T2 as shown in FIG. 1) of the non-volatile memory cell 500 is constructed by the second source region 205-2, the first drain region 203-2A of the second pair of drain regions 203-2, and a portion of the gate strip structure 222 (such as the first gate G2 as shown in FIG. 1) between the second source region 205-2 and the first drain region 203-2A. In one embodiment, the resistive switching element 210-1A is coupled to the first drain region 203-1A of the first transistor (such as the first transistor T1 as shown in FIG. 1), and the resistive switching element 210-2A is coupled to the first drain region 203-2A of the second transistor (such as the first transistor T2 as shown in FIG. 1). It should be noted that the resistive switching elements 210-1A and 210-2A are respectively coupled to the different top electrode contact plugs 224-1 and 224-2. Also, the resistive switching element 210-1A of the non-volatile memory cell 500 is coupled to the resistive switching element 210-1B of another non-volatile memory cell adjacent thereto through the top electrode contact plug 224-1. The resistive switching element 210-2A of the non-volatile memory cell 500 is coupled to the resistive switching element 210-2B of another non-volatile memory cell adjacent thereto through the top electrode contact plug 224-2.

Figure 8:
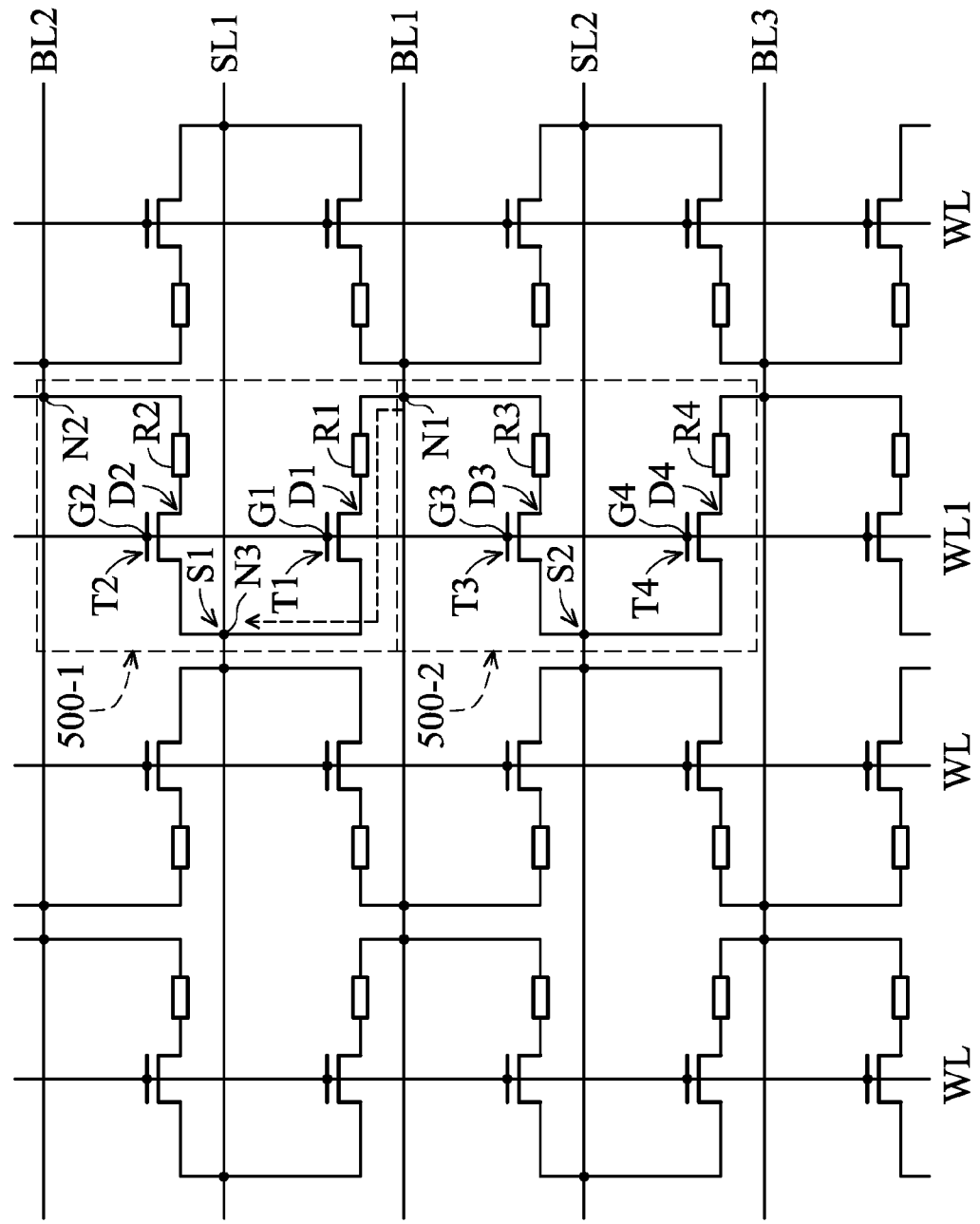
FIG. 8 is a schematic diagram showing an array consisting of one transistor and one resistive random access memory (RRAM) cell (1T1R) structure constructed by one exemplary embodiment of non-volatile memory cells of the disclosure.

FIG. 8 is a schematic diagram showing a non-volatile memory device 600, which is arranged as an array consisting of one transistor and one resistive random access memory (RRAM) cell (1T1R) structure constructed by one exemplary embodiment of non-volatile memory cells of the disclosure. Hereinafter, elements of the embodiments that are the same or similar as those previously described with reference to FIG. 1 are not repeated for brevity. As shown in FIG. 8, two non-volatile memory cells 500-1 and 500-2 are used to describe an operation method of the non-volatile memory cell 500-1. As shown in FIG. 8, the non-volatile memory cell 500-1 is controlled by a word line WL1, a first bit line BL1, a second bit line BL2 and a first source line SL1. The non-volatile memory cell 500-2 adjacent to the non-volatile memory cell 500-1 is controlled by a word line WL1, a second bit line BL2, a third bit line BL3 and a second source line SL2. For example, transistors T3 and T4 of the non-volatile memory cell 500-2 are coupled to the word line WL1. A source region S2, which is commonly used by the transistors T3 and T4, is coupled to the second source line SL2. A drain region D3 of the transistor T3 is coupled to a resistive switching element R3, and a drain region D4 of the transistor T4 is coupled to a resistive switching element R4. Additionally, the resistive switching element R3 of the non-volatile memory cell 500-2 is coupled to the first bit line BL1. The resistive switching element R4 of the non-volatile memory cell 500-2 is coupled to the third bit line BL3. In one embodiment, a resistive switching element R1 of the non-volatile memory cell 500-1 and the resistive switching element R3 of the non-volatile memory cell 500-2 are coupled to the first bit line BL1 through the node N1.

Embodiments provide a non-volatile memory device, for example, a random access memory (RRAM) device. One exemplary embodiment of a non-volatile memory cell includes two transistors and two resistive switching elements coupled to the drain regions of the two transistors. It should be noted that the two resistive switching elements of the same non-volatile memory cell are respectively coupled to (two) different top electrode contact plugs. Also, each of the top electrode contact plugs is used to couple one of the resistive switching elements of the non-volatile memory cell to one of the resistive switching elements of another non-volatile memory cell adjacent thereto. In one embodiment, the top electrode contact plugs of the non-volatile memory cell are formed using a dual-damascene process. Also, the non-volatile memory cell is designed such that the source line and the bit line are arranged belonging to the same metal layer and parallel to each other. Further, the word line is designed to be perpendicular to the source line and the second bit line. The space for the routings of the non-volatile memory device is increased.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory device, comprising:
    a first non-volatile memory cell configured to store two-bit data, comprising:
        a first transistor and a second transistor disposed on a substrate, wherein the first transistor and the second transistor commonly use a first source region, and wherein a first gate of the first transistor and a second gate of the second transistor are different portions of a word line;
        a first resistive switching element and a second resistive switching element respectively coupled to a first drain region of the first transistor and a second drain region of the second transistor;
        a first source line coupled to the first source region;
        a first bit line coupled to the first resistive switching element; and
        a second bit line coupled to the second resistive switching element,
    wherein the first source line, the first bit line and the second bit line belong to a same-level metal layer and are parallel to each other, and
    wherein the word line is perpendicular to the first source line, the first bit line and the second bit line,
    a second non-volatile memory cell configured to store two-bit data, comprising a third resistive switching element and a fourth resistive switching element; and
    a top electrode contact plug coupled to the first resistive switching element of the first non-volatile memory cell and the third resistive switching element of the second non-volatile memory cell.

2. The non-volatile memory device as claimed in claim 1, wherein the non-volatile memory device further comprises a bottom electrode contact plug coupled to the first resistive switching element,
    wherein the first resistive switching element comprises:
        a bottom electrode disposed on and in contact with the bottom electrode contact plug;
        a resistive switching layer disposed on the bottom electrode; and
        a top electrode disposed on the resistive switching layer, and
    wherein the top electrode contact plug disposed on and in contact with the top electrode.

3. The non-volatile memory device as claimed in claim 1, wherein the third resistive switching element of the second non-volatile memory cell is coupled to the first bit line, and wherein a third transistor and a fourth transistor of the second non-volatile memory cell commonly use a second source region.

4. The non-volatile memory device as claimed in claim 3, further comprising:
    a second source line coupled to the second source region of the second non-volatile memory cell; and
    a third bit line coupled to the fourth resistive switching element of the second non-volatile memory cell,
    wherein the second source line, the first bit line and the third bit line belong to the metal layer and are parallel to each other, and
    wherein a first gate of a first transistor and a second gate of a second transistor of the second non-volatile memory cell are different other portions of the word line, and wherein the word line is perpendicular to the second source line and the third bit line.

5. A non-volatile memory device, comprising:
    a gate strip structure disposed on a substrate along a first direction, wherein the gate strip structure serves as a word line;
    a first source region and a second source region disposed on a first side of the gate strip structure;
    a first pair of drain regions and a second pair of drain regions disposed on a second side of the gate strip structure;
    a first source contact coupled to the first source region and the second source region;
    a first bottom electrode contact plug, a second bottom electrode contact plug, a third bottom electrode contact plug and a fourth bottom electrode contact plug disposed on the substrate and coupled to the first and second pairs of drain regions;
    a first resistive switching element, a second resistive switching element, a third resistive switching element and a fourth resistive switching element disposed on the first, second, third and fourth bottom electrode contact plugs, respectively;
    a first top electrode contact plug and a second top electrode contact plug disposed on the first, second, third and fourth resistive switching elements, wherein the first top electrode contact plug is coupled to the first and second resistive switching elements, and the second top electrode contact plug is coupled to the third and fourth resistive switching elements;
    a source contact plug disposed on the first source contact;
    a first bit line and a second bit line disposed on the first and second top electrode contact plugs, wherein the first and second bit lines are respectively coupled to the first and second top electrode contact plugs; and
    a first source line disposed on the source contact plug, wherein the first source line is coupled to the first source region,
    wherein the first source line, the first bit line and the second bit line, which are extended along a second direction, belong to a metal layer and are parallel to each other, and
    wherein the word line is perpendicular to the first source line, the first bit line and the second bit line, respectively.

6. The non-volatile memory device as claimed in claim 5, wherein the first source region, a first drain region of the first pair of drain regions, and a portion of the gate strip structure therebetween belong to a first non-volatile memory cell.

7. The non-volatile memory device as claimed in claim 5, wherein the second source region, a second drain region of the second pair of drain regions, and another portion of the gate strip structure therebetween belong to a second non-volatile memory cell.

8. The non-volatile memory device as claimed in claim 5, wherein the first source region and the second source region are separated from each other.

9. The non-volatile memory device as claimed in claim 5, wherein the first pair of drain regions and the second pair of drain regions are separated from each other, and wherein the first pair of drain regions comprises a first drain region and a second drain region separated from each other, and the second pair of drain regions comprises a third drain region and a fourth drain region separated from each other.

10. The non-volatile memory device as claimed in claim 5, wherein the first direction is perpendicular to the second direction.

* * * * *